(12) United States Patent
Böhm

(10) Patent No.: US 7,164,280 B2
(45) Date of Patent: Jan. 16, 2007

(54) ELECTRICAL TEST DEVICE

(75) Inventor: Gunther Böhm, Nufringen (DE)

(73) Assignee: Feinmetall GmbH (DE)

( * ) Notice: Subject to any disclaimer, the term of this patent is extended or adjusted under 35 U.S.C. 154(b) by 0 days.

(21) Appl. No.: 11/127,901

(22) Filed: May 12, 2005

(65) Prior Publication Data

US 2005/0253608 A1    Nov. 17, 2005

(30) Foreign Application Priority Data

May 14, 2004    (DE)    ............ 10 2004 023 987

(51) Int. Cl.
    *G01R 31/02*    (2006.01)
(52) U.S. Cl. ................... 324/761; 324/754
(58) Field of Classification Search ............. 324/754, 324/761, 762, 765, 158.1
    See application file for complete search history.

(56) References Cited

U.S. PATENT DOCUMENTS

| | | | |
|---|---|---|---|
| 3,806,801 A | 4/1974 | Bove | .............. 324/72.5 |
| 5,949,244 A * | 9/1999 | Miley | .............. 324/762 |
| 6,710,615 B1 * | 3/2004 | Miki | .............. 324/761 |
| 6,759,842 B1 * | 7/2004 | Weimer | .............. 324/158.1 |
| 6,822,466 B1 * | 11/2004 | Holcombe et al. | .......... 324/761 |
| 2003/0085721 A1 | 5/2003 | Eldridge et al. | ............ 324/754 |

* cited by examiner

*Primary Examiner*—Ha Tran Nguyen
*Assistant Examiner*—Tung X. Nguyen
(74) *Attorney, Agent, or Firm*—Ostrolenk, Faber, Gerb & Soffen, LLP

(57) ABSTRACT

An electrical test device, in particular for testing wafers, having a contact head, which is associated with the test object and is provided with pin-shaped contact elements that are arrayed to form a contact pin arrangement. An electrical connection apparatus, including contact faces which are in touching contact with ends of the contact elements which face away from the test object. A centering device, which permits only radial play for thermal expansion by sliding guides, for centrally aligning the contact head and the connection apparatus with respect to one another.

24 Claims, 5 Drawing Sheets

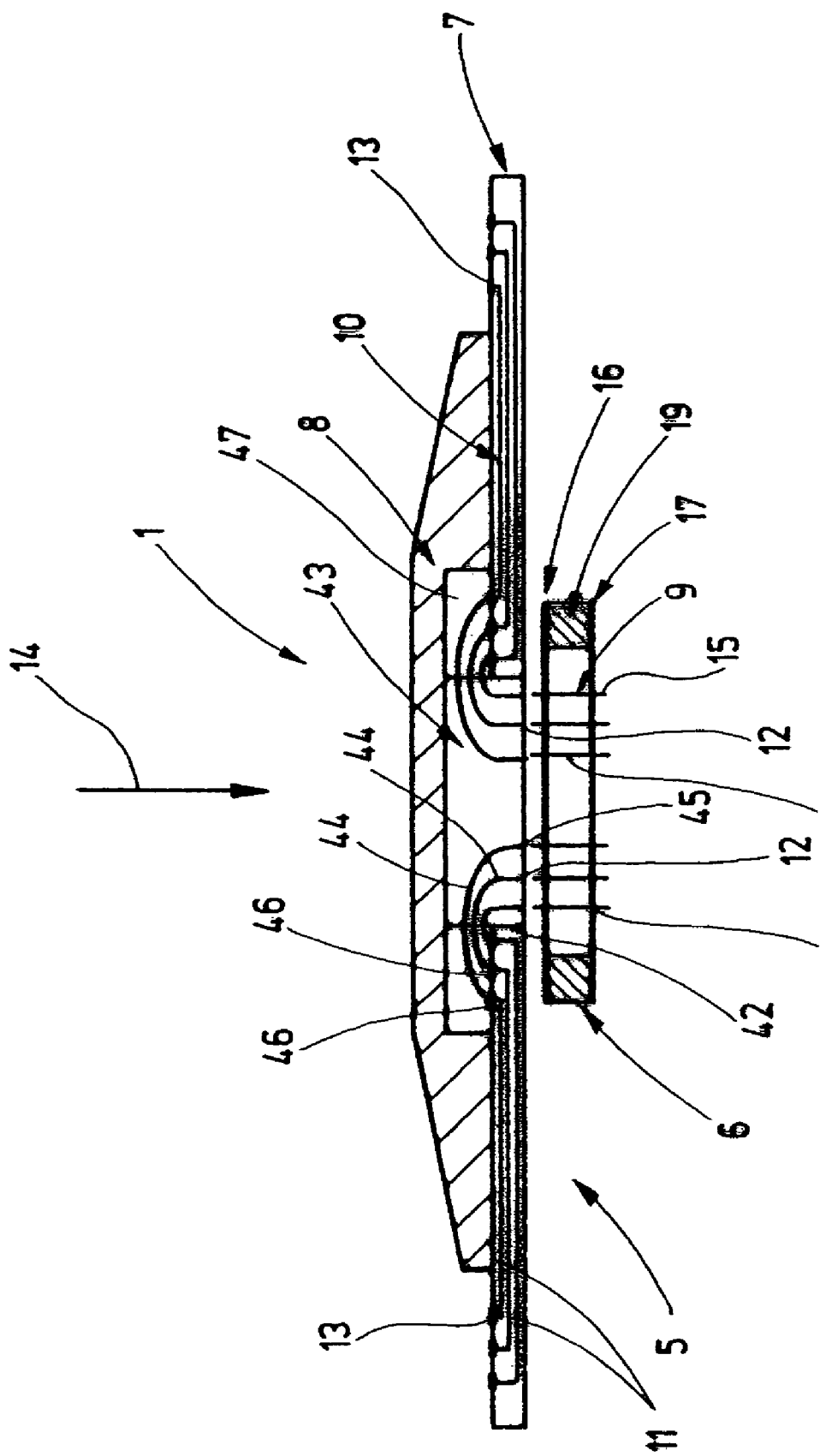

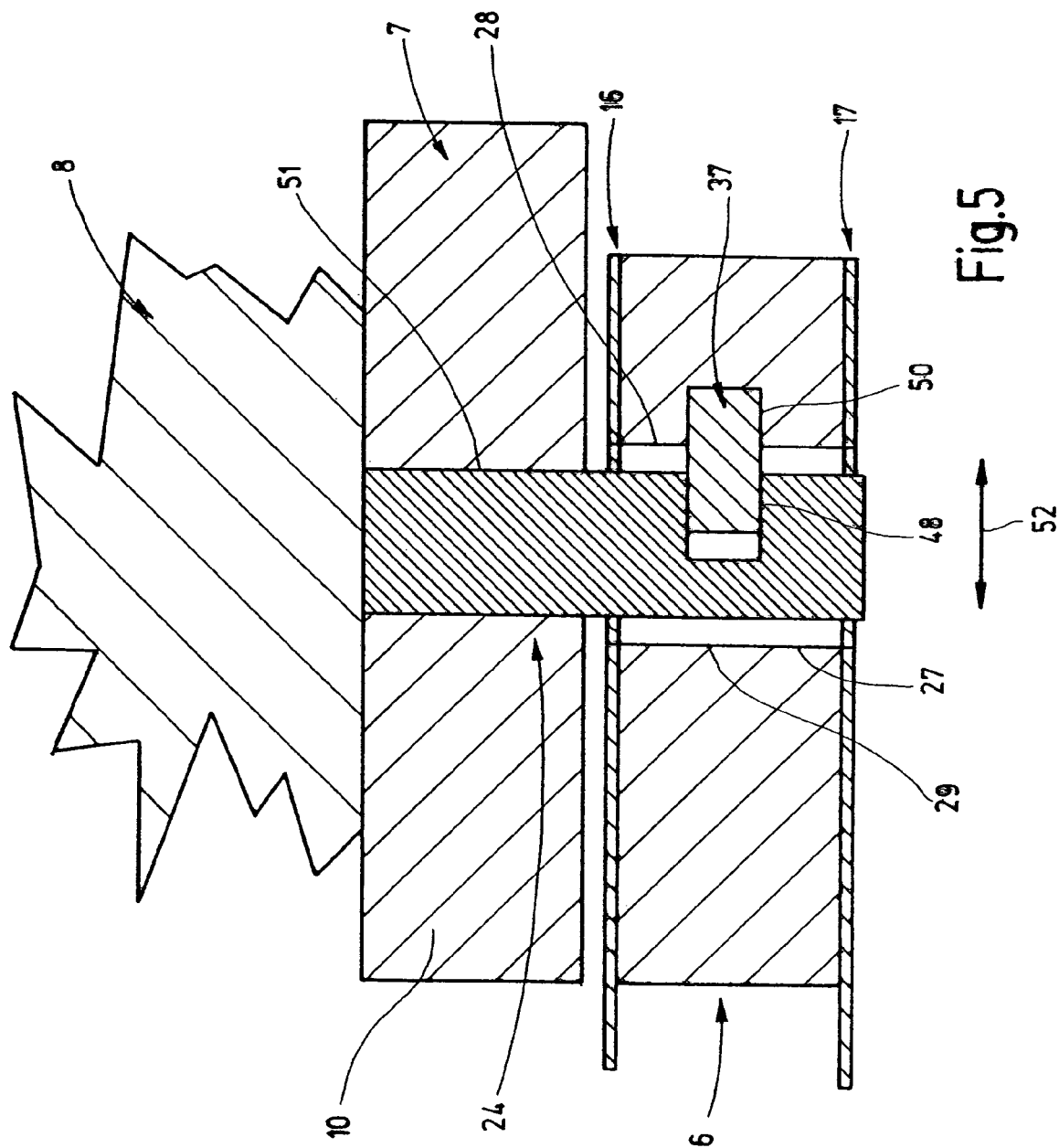

ELECTRICAL TEST DEVICE

BACKGROUND OF THE INVENTION

The invention relates to an electrical test device, in particular for the purpose of testing wafers, having a contact head, which is associated with the test object and is provided with pin-shaped contact elements forming a contact pin arrangement, and having an electrical connection apparatus, which has contact faces which are in touching contact with the ends of the contact elements which face away from the test object.

Electrical test devices of the type mentioned initially serve the purpose of making electrical contact with a test object in order to test its functionality. The electrical test device produces electrical connections to the test object, i.e., on the one hand, it makes contact with electrical connections of the test object, and, on the other hand, makes available electrical contacts which are connected to a test system which supplies electrical signals to the test object via the test device in order to carry out, for functional testing purposes, for example, resistance measurements and current and voltage measurements etc. Since the electrical test object is often an extremely small electronic component, for example a wafer, from which electronic components are produced, the pin-shaped contact elements of the contact head have very small dimensions. In order to make possible a connection to the mentioned test system, the contact elements of the testing head are in touching contact with a connection apparatus which carries out a conversion to a greater contact spacing and, in this regard, makes possible connection of electrical connecting cables which lead to the test system. Since different room temperatures may be present during testing and the testing is preferably also carried out at different test object temperatures in order to be able to test its operation within a specific temperature range as well, in the case of the known electrical test devices there is the risk that, owing to thermally induced changes in the length, contact between the contact elements and the associated contact faces of the connection apparatus is not always ensured in a fault-free manner owing to positional errors brought about. These shifts in position result from different coefficients of thermal expansion of the materials used, it being necessary for design reasons to use specific materials such that the abovementioned problem cannot be resolved by selecting the same material for the contact head and the connection apparatus. Different degrees of heating of individual parts also lead to shifts in position.

SUMMARY OF THE INVENTION

The invention is therefore based on the object of making available a test device of the type mentioned initially, in the case of which the above mentioned problems do not occur.

This object is achieved in the case of an electrical test device of the type mentioned initially by a centering device, which permits only radial play for thermal expansion by means of sliding guides, for the purpose of centrally aligning the contact head and the connection apparatus with respect to one another. The electrical test device according to the invention, which is also referred to as a vertical test card, thus has the centering device between the contact head and the connection apparatus, and this centering device ensures that changes in length occurring owing to thermal play only start from the respective center of the above mentioned components and are each present in the radial direction owing to the correspondingly shaped sliding guides. The centers of the contact head and the connection apparatus lie diametrically opposite one another; in particular, they are located on the same mid-high axis of the abovementioned components. Therefore, although changes in length will occur according to the invention owing to thermal play and owing to the different materials, these changes in length, owing to the abovementioned centering device in conjunction with the radial sliding guides, will not add up to such a high value that an end face of a contact element no longer meets the associated contact face of the connection apparatus, and reliable contact is thus ensured. If a design according to the invention is not provided, the above mentioned centering is not ensured. This lack may result, for example, in touching contact points between edge-side contact elements lying centrally, in a fault-free manner, on the respectively associated contact face of the connection apparatus, but (when viewed over the diagonal longitudinal extent of the entire contact pin arrangement) in the contact elements which lie diametrically with respect thereto lying already so far apart in terms of their position in relation to the associated contact faces, and owing to the changes in length, that the positional errors only allow for an edge electrical contact, or even no contact at all can now be made, since their end faces no longer meet the associated contact faces, but lie next to them, i.e. such that they are supported on the insulating material of the connection apparatus.

One development of the invention provides for the centering device to be arranged outside of the pin arrangement. This allows for the region of the contact pin arrangement to be kept free of the centering means, such that the area around the respective center of the connection apparatus and the contact head is available exclusively for the purpose of accommodating pin-shaped contact elements, and therefore the versatility is maintained for the purpose of adapting it to different test objects.

It is advantageous if the centering device has at least three sliding guides which are arranged such that they are offset at an angle with respect to one another. These three sliding guides are preferably offset at an angle with respect to one another of 120°, or otherwise, for example, the first of the three sliding guides forms an angle with the second sliding guide of 90°, and the second sliding guide likewise forms an angle with the third sliding guide of 90°, so that the third sliding guide lies offset at an angle with respect to the first sliding guide of 180°. This clearly dictates the centering, i.e. a positional offset in the center of the test device on the contact plane (X-Y plane) cannot result. Provision is made, in particular, for four sliding guides which lie such that they are offset at an angle with respect to one another of 90°.

One development of the invention provides for each of the sliding guides to be formed by a projection on one of the contact head or the connection apparatus and a depression in the other of the connection apparatus and/or the contact head which accommodates the projection with radial play but without play in the circumferential direction. Each of the sliding guides therefore allows for displacement of the projection in the depression only in one direction, the radial direction, i.e. (starting from the center of the test device) in each case correspondingly radially outwards. The abovementioned circumferential direction, in which there is no play, runs transversely with respect to the radial direction (parallel with respect to the test plane), such that a rotary offset between the contact head and the connection apparatus is ruled out. During testing, the ends of the pin-shaped contact elements which face the test object approach the test object perpendicular to the test plane, i.e. in the axial direction, in order to make contact with the test object. In this direction, the contact element and the test head also move towards one another in order to establish electrical contact between these two components.

In particular, provision may be made for the projection to be in the form of a profiled pin. The cross-sectional profile of the pin is circular or preferably not circular but deviating from the circular shape in order to ensure radial guidance in interaction with the walls of the depression.

In particular, the depression is in the form of an aperture, preferably in the form of an elongate hole.

In one development of the invention, the projection passes through the connection apparatus and extends into a supporting apparatus which acts on the connection apparatus. In this case, the projection may be fixed to the supporting apparatus. This takes place using one end region of the projection. The other end region of the projection can preferably be fixed to the contact head. In order to separate or to be able to separate axially the arrangement comprising the supporting apparatus and the contact head so as to release the connection apparatus, the contact pin has, in particular, a split formation and therefore has a separation joint in the region of the connection apparatus. This design makes it possible for the two sections of the projection to be aligned with respect to one another without play in the circumferential direction by means of the radial sliding guide formed, but to be able to assume positional deviations in the radial direction (in relation to the center of the test device) owing to different thermal coefficients, without any problems, while maintaining the full functionality of the electrical test device. The separation joint between the two parts of the projection lies in particular on a plane which runs parallel to the test plane. One development of the invention provides for the projection or the profiled pin to have two parallel, planar guide faces on its outer surface, which lie diametrically opposite one another and which each run parallel to the radial direction of the test device. "Radial direction" is understood to mean (as explained above) the respective radial direction (starting from the center of the test device) which runs parallel to the test plane.

It is advantageous if the projection is held without play on all sides in a fixing depression in the supporting apparatus. If the projection is, for example, the abovementioned profiled pin, the profiled pin is held for fixing purposes within the fixing depression with one of its end regions on the supporting apparatus. Its free end protrudes away from the corresponding component in order to receive another component or a plurality of other components, which has or have a depression allowing radial displacements or depressions allowing radial displacements, for the purpose of forming the radial sliding guide.

In particular, the depression may have parallel depression walls, between which the guide means, in particular guide faces of the projection or profiled pin are accommodated without play or essentially without play. As long as the depression is a groove or an aperture, the groove is equipped with parallel groove walls or the aperture is equipped with parallel aperture walls for the purpose of forming the respective radial sliding guide. In order to provide the radial displacement possibility based on the center, the depression, the groove or the aperture is in the form of an elongate hole.

In particular, the walls of the depression, groove walls or aperture walls are each formed such that they run parallel to the radial direction of the test device. This is likewise true for the parallel, planar guide faces of the respectively associated projection or profiled pin.

The connection apparatus may preferably be in the form of a printed circuit board. In this case, it is, in particular, a multilayer printed circuit board, i.e. it has conductor tracks which lie on different planes of the board. The conductor tracks lead on the one hand to the abovementioned contact faces, which interact electrically with the contact elements of the test head, and lead on the other hand to connections which (for example, via cable connections) lead to the test system.

Contact pins may be used as the contact elements, for example spring contact pins or (in the case of very small dimensions, for example, for wafer testing) bent wires. The contact elements are mounted in the contact head such that they can be displaced longitudinally.

In addition, it is advantageous when the projection, in particular the profiled pin, has an edge-side slot, which becomes an opening in the contact head and/or the supporting apparatus, and when a fitting element, in particular a fitting strip, is pushed into the slot and the opening for the purpose of axially fixing the projection. The projection is axially fixed, but can be displaced in directions which are at 90° to it owing to the frictional engagement of the fitting element in the slot and/or opening, i.e. the projection can displace radially to allow for the abovementioned thermal expansions. The opening leads laterally from the depression, with the slot and the opening being oriented in the radial direction.

Other features and advantages of the present invention will become apparent from the following description of the invention which refers to the accompanying drawings.

BRIEF DESCRIPTION OF THE DRAWINGS

The drawings illustrate the invention with reference to exemplary embodiments, and in the drawings:

FIG. 4 shows an electrical test device according to a further exemplary embodiment, and FIG. 5 shows a cross-sectional view in the region of a sliding guide according to another exemplary embodiment.

DETAILED DESCRIPTION OF EMBODIMENTS OF THE INVENTION

Figure 1:
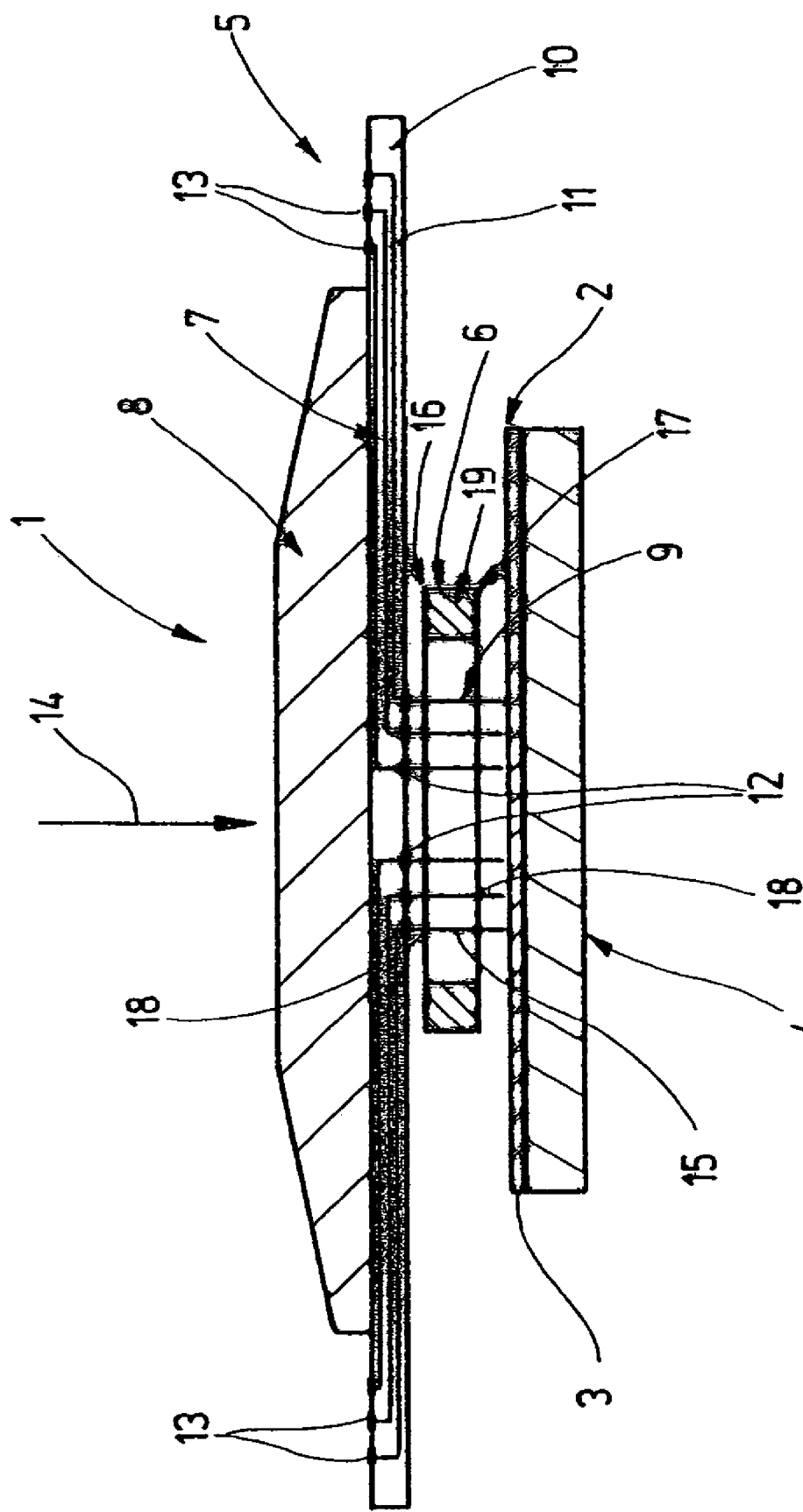
FIG. 1 shows a schematic cross-sectional view through an electrical test device.

FIG. 1 shows a schematic illustration of the cross section through an electrical test device 1, which can be connected to a test system (not shown) for the purpose of making contact with a test object 2 by means of an electrical cable connection (not shown), in order to subject the test object to an electrical test. The test object 2, which may be in the form of a wafer 3, is located on a supporting carrier 4, which is referred to as a chuck, which can be cooled or heated. This makes it possible for the test object to be subjected to different temperatures during the electrical test, for example in the range from −50° C. to +200° C., in order to test whether it operates in a fault-free manner over this temperature range.

In order to make contact with corresponding connection points on the wafer 3, a vertical test card 5 is provided which forms the test device 1.

The test device 1 has a contact head 6 and a connection apparatus 7. The connection apparatus 7 is supported on a support 8. The contact head 6 is provided with a large number of contact elements 9, which are mounted such that each element 9 can be displaced longitudinally. Each element 9 has one end region associated with the test object 2 and another end region associated with the connection apparatus 7. The connection apparatus 7 is in the form of a multilayer printed circuit board 10 having conductor tracks 11. The conductor tracks 11 have contact faces 12 at their ends which are associated with the contact head 6. The contact faces 12 are associated with the respective contact elements 9 and have electrical connection faces 13 at their radially outer ends. The connection faces 13 may be connected to the test system (not shown) via the abovementioned cable connections (likewise not shown). The arrangement enables the connection apparatus 7 to form a conversion apparatus, i.e. the very narrow spacing between the extremely small contact faces 12 (each having a diameter of, for example, 50 to 300 µm) is converted via the conductor tracks 11 into larger spacings between the connection faces 13. The connection faces 13 also each have the same size in order to be able to produce the cable connections.

During testing of the test object 2, the test device 1 supported by the support 8 moves in the axial direction (arrow 14) towards the test object 2 such that the ends of the contact elements 9 meet on the one hand the wafer 3 and on the other hand the contact faces 12. Since the contact elements 9 are in the form of bent wires 15, i.e. they are designed to be slightly resilient in the axial direction when flexed, it is possible to make contact at both ends of the elements 9 in a fault-free manner.

The contact head 6 has two parallel ceramic plates 16 and 17, which are spaced apart and are provided with bearing holes 18 for accommodating the bent wires 15. The parallel spaced-apart position of the two ceramic plates 16 and 17 is realized by use of a spacer 19.

Figure 2:
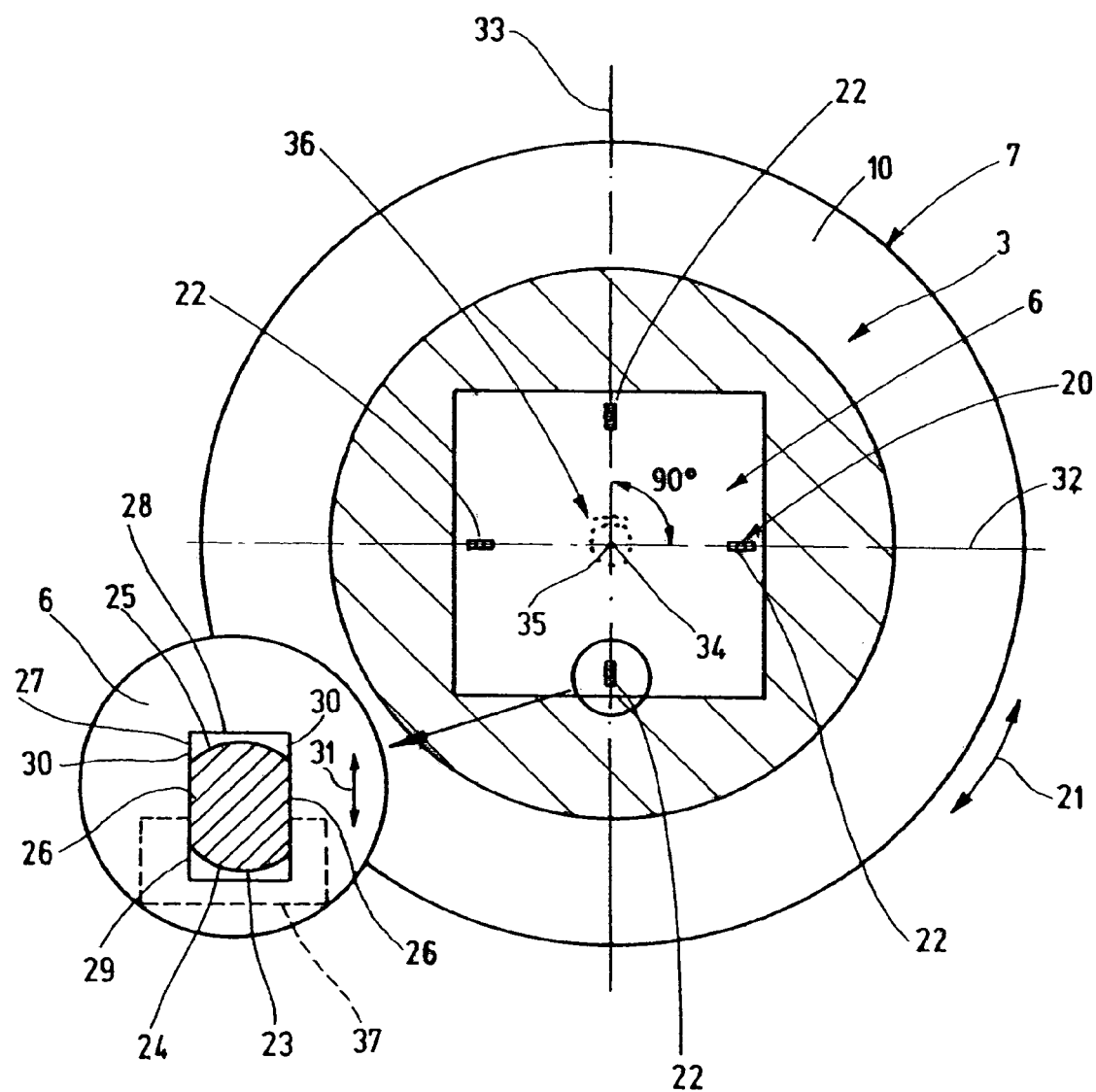
FIG. 2 shows a plan view of the test device in FIG. 1, omitting parts which are not relevant to the invention.

In place of a known rigid, fixed connection between the contact head 6 and the connection apparatus 7, the invention provides a centering device 20 between the above mentioned components which is formed by four sliding guides 22, which lie offset with respect to one another with an angular spacing of 90° in the circumferential direction (double arrow 21), as shown in FIG. 2. In addition, FIG. 2 shows that the wafer 3 may be in the form of a circular plate. It has integrated circuits (not shown). In order to electrically test the circuits, the contact head 6, which is square in plan view, with its bent wires 15 (not shown in FIG. 2) is lowered a number of times in different respective positions onto the wafer in order each time to test a corresponding region of the wafer 3. The sliding guide 22 at the bottom in FIG. 2 is illustrated in enlarged form. It has a projection 23 in the form of a profiled pin 24, which protrudes in the axial direction (in the opposite direction to arrow 14 in FIG. 1) from the contact head 6. The profiled pin 24 has two parallel, planar guide faces 26 on its outer surface 25, which lie diametrically opposite one another. In addition, the profiled pin 24 extends with its free end into a depression 27 which is formed on the connection apparatus 7, i.e. on the printed circuit board 10. The depression 27 is preferably in the form of an aperture 28 in the printed circuit board 10. It has the shape of an elongate slot or hole 29. The depression 27 has two depression walls 30, which run parallel to one another and which lie spaced apart with respect to one another such that they accommodate the guide faces 26 of the profiled pin 24 essentially without play. The longitudinal extent of the elongate hole 29 is greater than the corresponding longitudinal dimension of the profiled pin 24, enabling relative movement in the direction of the double arrow 31 between the contact head 6 and the connection apparatus 7, i.e. the printed circuit board 10, as shown in FIG. 2. Relative movement transverse thereto is not possible, since this movement is prevented by the guidance of the guide faces 26 on the depression walls 30.

FIG. 2 shows that the four sliding guides 22 are arranged such that they lie on two imaginary radials 32 and 33 which intersect one another at an angle of 90°, the radials 32 and 33 intersecting one another at a center point 34, and the center point 34 forming the center 35 of the test device 1 and also of the region of the test object 2 to be tested. The bent wires 15 which form a contact pin arrangement 36 are arranged around the center 35. The four sliding guides 22 are located such that they lie radially outside of the contact pin arrangement 36, the longitudinal extents of the elongate holes 29 being oriented such that they each lie centrally on the radials 32 and 33. The guide faces 26 of the individual profiled pins 24 are designed to correspond to the elongate hole alignment of the elongate holes 29.

It is clear from all of this that, in the case of a material expansion or material shrinkage produced by thermal loading, the components (contact head 6 and connection apparatus 7) are fixed with respect to one another in the region of the center 35 owing to the centering device 20, and relative movements can only take place in the direction of the radials 32 and 33. As a result, the above mentioned changes in length, which result from different coefficients of thermal expansion of the materials used for the components, should not lead to offset paths which are so large that the ends of the bent wires 15 associated with the printed circuit board 10 no longer meet the contact faces 12. The centering owing to the centering device 20 should prevent such large offset paths, since the changes in length that occur start from the center and thus lie symmetrically with respect to the center and are thus only half as large (when viewed in the radial direction) as an offset which could occur (if the invention were not used) if outer bent wires 15 come into contact centrally with the associated contact faces 12, such that the diametrically opposing, likewise outer bent wires 15 lead to erroneous contacts owing to the accumulating expansions or shrinkage in length.

Figure 3:
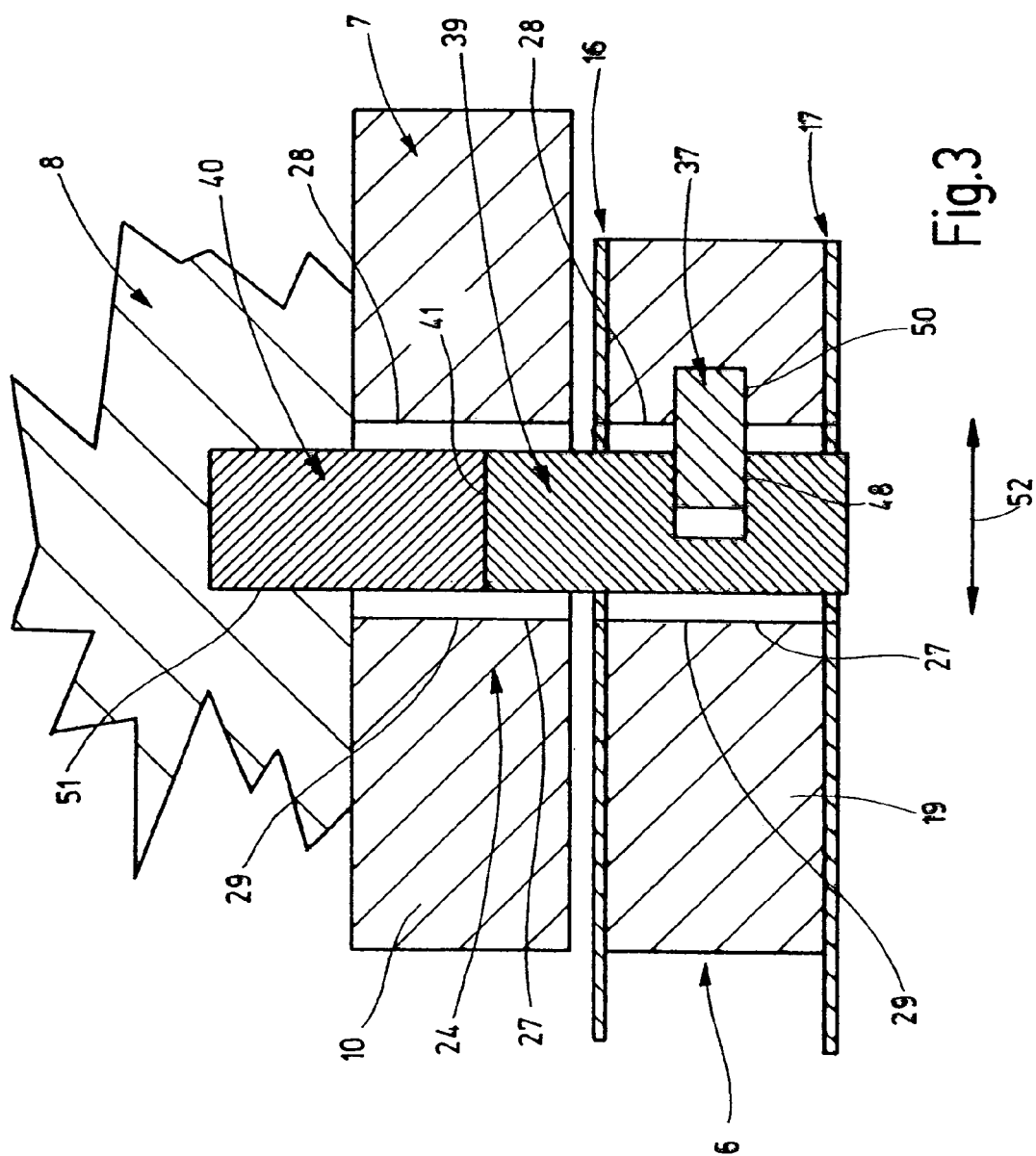
FIG. 3 shows a cross-sectional view in the region of a sliding guide of the arrangement in FIGS. 1 and 2.

FIG. 3 shows that the respective profiled pin 24 is held axially in the spacer 19 within the depression 27 by means of a fitting strip 37. Of course, other types of fixing are also possible which allow for thermal expansions in the radial direction and make possible axial fixing. In addition, FIG. 3 shows one difference in the profiled pin formation compared to the configuration shown in FIG. 2. In FIG. 3, the profiled pin 24 is of two-part design, comprising a first pin part 39, which is fixed to the contact head 6, and a second pin part 40, which is fixed to the supporting apparatus 8. A separation joint 41, which lies in the region of the connection apparatus 7, i.e. the printed circuit board 10, is formed (in the state shown in FIG. 3) between the two pin parts 39 and 40. The profile of the two pin parts 39 and 40 corresponds to the profile as shown in the enlarged region of FIG. 2. This applies correspondingly also to the depression 27 in the printed circuit board 10 and the depression 27 in the contact head 6. The two depressions 27 are in the form of apertures 28 and elongate holes 29. The elongate hole directions are illustrated in FIG. 3 by the arrow 52. These are radial directions. The pin part 39 is provided laterally with a slot 48, to which a lateral opening 50 in the contact head 6 leads. A fitting strip 37 is pushed into the slot 48 and the opening 50. The opening 50 leads from the elongate hole 29 in the contact head 6 and has a radial direction (arrow 52). It is clear from all of this that the individual components can easily be separated from one another and assembled again without any problems in the axial direction and that, nevertheless, centering takes place, as has been described with reference to FIG. 2. In addition, owing to the pin splitting, different, temperature-dependent changes in length between the contact head 6 and the printed circuit board 10, on the one hand, and the supporting apparatus 8 and the printed circuit board 10, on the other hand, can occur. Owing to the pin part 39, guided by the fitting strip, the pin part can move radially within the elongate hole 29 in the contact head 6 and within the elongate hole 29 in the printed circuit board 10 in the radial direction. The pin part 40 is fixed, in particular pressed in, in the supporting apparatus 8 without play on all sides by means of a fixing depression 51. A displacement on a plane which lies parallel to the test plane is therefore not possible relative to the supporting apparatus 8. Owing to the elongate hole 29 in the printed circuit board 10, however, a relative displacement in the radial direction between the supporting apparatus 8 and the printed circuit board 10 is possible. In addition, the two pin parts 39 and 40 can move in relation to one another in the radial direction.

FIG. 4 shows a further exemplary embodiment of a test device which differs from the exemplary embodiment shown in FIG. 1 merely by the fact that the printed circuit board 10 has a central opening 42 in which a casting block 43 is introduced. Electrical connecting wires 44 are cast in the block 43 and form, with their first end faces 45, the above mentioned contact faces 12 for the bent wires 15. The other ends of the wires lead to conductor track connections 46 which lie on the side of the printed circuit board 10 which is remote from the contact head 6 in a hollow 47 in the supporting apparatus 8. The connection of the electrical connecting wires 44 to the conductor track connections 46 preferably takes place by means of soldering or welding. The exemplary embodiment in FIG. 4 of course likewise has the centering device 20 according to the invention which is, however, not illustrated in FIG. 4.

All of this means that the four-slot centering according to the invention of the vertical test card 5 aligns the contact head 6 and the connection apparatus 7 (connection head or connector) centrally with respect to one another and almost fixes them in relation to one another in the region of the center 35. The connector is generally in the form of a printed circuit board, which is supported on the supporting apparatus 8 for the purpose of preventing deflections or the like. This supporting apparatus 8 is also referred to as a stiffener and is preferably made of metal. If direct contact is made with the printed circuit board 10 by the contact elements 9 of the contact head 6, there is a direct attachment design (FIG. 1). If contact is made via inter-mediate wires, via the connecting wires 44 shown in FIG. 4, this is referred to as a wired connection head (wired connector). The faces on the connector with which contact is to be made are very small. They typically have a diameter between 50 μm and 300 μm.

Testing of the test object 2 may take place both at room temperature and at very high or low temperatures. In the case of a wafer, said wafer is generally heated to 200° C. and then cooled to −50° C. in order to test whether its operation is ensured within this temperature range. Owing to the very high or very low wafer temperatures, the components of the test device 1 correspondingly heat up or are correspondingly cooled down. Since, as has been mentioned, the coefficients of thermal expansion of the materials used are different, and these materials also reach different temperatures during the test, positional errors of the individual components in relation to one another result, i.e. shifts in position of the stiffener, the printed circuit board, the ceramic plates 16, 17, the spacer 19, the wafer 3 and/or the carrier 4. In order to minimize the positional errors produced by these temperature differences and to prevent insufficiently accurate meeting of the contact elements with the connector and/or the contact elements with the wafer and thus to prevent unstable contacts from being made, the above mentioned components are centered in relation to one another according to the invention by means of the centering device 20, i.e. are not fixedly connected to one another, which could lead to mechanical stresses and possibly to damage to the components.

In the event of an expansion of the printed circuit board 10, the invention ensures that the central position, i.e. the center 35, of the printed circuit board is not displaced but is fixed by means of the four profiled pins 24, in which case the expansion takes place uniformly, starting from the center 35 in all four directions corresponding to the radials 32 and 34. This also applies to the other components, namely, to the contact head 6 or to the supporting apparatus 8, as long as it is included in the centering device 20 in accordance with the arrangement in FIG. 3.

The invention accordingly allows for a relative positional displacement of the components with respect to one another caused by the different thermal expansion of the individual components, but this positional displacement is reduced to the unavoidable level, and in each case the central position is maintained.

In principle, the projections 23, i.e. the profiled pins 24, can be fixed to the respective components by means of cross screws. The profiled pins 24 may be provided, in particular, with the edge-side slots 48, which run transversely with respect to their longitudinal axes and with which the corresponding openings 50 in the spacer 19 are aligned. The openings 50 lead laterally from the depressions 27 into which end regions of the profiled pins 24 are inserted. As shown in FIGS. 2 and 3, fitting strips 37 are pushed into the slots 48 and associated openings 50 and fix the vertical position of the alignment pins (profiled pins 24) with respect to the spacer without impeding radial expansion movements. The directions of the arrow 31 in FIG. 2 correspond to those of the arrow 52 in FIG. 3.

Provision is made, in particular, for at least three, for example four, alignment pins to be used. A preferred embodiment also envisages six alignment pins which lie evenly spaced apart at an angle with respect to one another. The alignment pins may be round, flattened at the sides, rectangular, etc. in cross section. Provision may be made for the components (the guide plates (ceramic plates 16, 17), the spacer and the printed circuit board) to be mounted on the stiffener without any interlocking horizontal connections. The components (the guide plates, the spacer and the printed circuit board) can be provided with the above mentioned elongate holes in order to make possible the desired radial movement in the case of central fixing.

FIG. 5 shows a further exemplary embodiment of a test device 1, which essentially corresponds to that in FIG. 3. Therefore, only the differences from FIG. 3 are described below. The embodiment in FIG. 3 applies correspondingly to this extent in the case of the exemplary embodiment in FIG. 5. One difference is the fact that the profiled pin 24 in FIG. 5 is an integral pin, with no separation joint 41. In addition, the supporting apparatus 8 is fixedly connected, in particular screwed, to the connection apparatus 7 (not shown in FIG. 5). The profiled pin 24 is fixed without play on all sides in a fixing depression 51 in the connection apparatus 7 and accordingly does not extend into the supporting apparatus 8. The remaining features correspond to those in FIG. 3.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An electrical test device comprising:
   a contact head, which is associated with a supported test object;
   contact elements arrayed at the contact head to form a contact pin arrangement, the contact elements having first ends for contacting the test object and opposite second ends away from the test object;
   an electrical connection apparatus, which has contact faces which are in touching contact with the second ends of the contact elements, the connection apparatus enabling electrical connection from the contact elements to another object;
   a centering device between the contact head and the connection apparatus, the centering device including sliding guides which permits only radial play for thermal expansion and operable for centrally aligning the contact head and the connection apparatus with respect to one another.

2. The test device as claimed in claim 1, wherein the centering device is arranged outside of the pin arrangement.

3. The test device as claimed in claim 1, wherein the centering device has at least three, sliding guides which are arranged offset at angles with respect to one another.

4. The test device as claimed in claim 3, wherein each of the sliding guides comprises a projection on one of the contact head and the connection apparatus and a cooperatingly shaped and positioned depression in the other of the connection apparatus and the contact head wherein the depression accommodates the projection.

5. The test device of claim 3, wherein the projection and the depression are so shaped and sized as to permit radial direction play between them but not circumferential direction play.

6. The test device as claimed in claim 5, wherein the projection is a profiled pin.

7. The test device as claimed in claim 6, wherein the depression is an aperture.

8. The test device as claimed in claim 6, wherein the depression is an elongate hole.

9. The test device as claimed in claim 5, further comprising a supporting apparatus for the test object, and the projection passes through the connection apparatus and extends into the supporting apparatus which acts on the connection apparatus.

10. The test device as claimed in claim 4, wherein the depression comprises a fixing depression in the supporting apparatus and the projection has lateral sides and is held without play on all of the lateral sides thereof in the depression.

11. The test device as claimed in claim 9, wherein the projection is fixed to the supporting apparatus.

12. The test device as claimed in claim 4, wherein the projection is fixed to the contact head.

13. The test device as claimed in claim 4, wherein the projection is split and has a separation joint in the region of the connection apparatus.

14. The test device as claimed in claim 13, wherein the separation joint lies on a plane which runs parallel to a test plane of the test object.

15. The test device as claimed in claim 4, wherein the projection has an outer surface with two parallel, planar guide faces lying diametrically opposite one another and each running parallel to a radial direction of the test device.

16. The test device as claimed in claim 15, wherein the depression has parallel depression walls.

17. The test device as claimed in claim 16, wherein the depression is a groove having parallel groove walls or the depression is an aperture having parallel aperture walls.

18. The test device as claimed in claim 4, wherein the depression has the form of an elongate hole.

19. The test device as claimed in claim 16, wherein the walls of the depression each run parallel to a radial direction of the test device.

20. The test device as claimed in claim 1, wherein the connection apparatus is a printed circuit board.

21. The test device as claimed in claim 1, wherein the contact elements comprise bent wires which are mounted in the contact pin arrangement such that they can be displaced longitudinally.

22. The test device as claimed in claim 4, wherein the projection comprises a profiled pin including an edge-side slot, and the slot becomes an opening in one of the contact head and the supporting apparatus, and
   a fitting element is in the slot and the slot opening for axially fixing the projection.

23. The test device as claimed in claim 22, wherein the opening leads laterally from the depression.

24. The test device as claimed in claim 22, wherein the slot and the opening are oriented in the radial direction.

* * * * *